United States Patent [19]
Layher et al.

[11] Patent Number: 5,336,357
[45] Date of Patent: Aug. 9, 1994

[54] MANUALLY OPERABLE DIE ATTACH APPARATUS

[75] Inventors: Francis W. Layher, Tucson, Ariz.; Francis A. Sutter, Gardnerville, Nev.

[73] Assignee: Quantum Materials, Inc., San Diego, Calif.

[21] Appl. No.: 30,702

[22] Filed: Mar. 12, 1993

[51] Int. Cl.5 .......................... H05K 3/30; B23P 19/00
[52] U.S. Cl. ..................................... 156/391; 156/285; 156/299; 156/556; 156/569; 156/579; 156/578; 29/840
[58] Field of Search ................... 29/840; 156/579, 391, 156/556, 569, 297, 578, 558, 299, 285, 64

[56] References Cited

U.S. PATENT DOCUMENTS

| | | |
|---|---|---|
| 3,715,258 | 2/1973 | Cunnane ............................. 156/356 |
| 3,834,966 | 9/1974 | Kelly ................................. 156/64 X |
| 3,855,034 | 12/1974 | Miller ............................... 156/556 X |
| 4,239,576 | 12/1980 | Taki et al. ......................... 29/840 X |
| 4,636,254 | 1/1987 | Husson, Jr. . | 
| 4,761,224 | 8/1988 | Husson, Jr. . |
| 4,868,979 | 9/1989 | Fukushima et al. ................. 29/840 |
| 4,951,388 | 8/1990 | Eguchi et al. .................. 156/578 X |
| 4,968,738 | 11/1990 | Dershem . |
| 5,155,903 | 10/1992 | Nakashima et al. ............. 29/840 X |

FOREIGN PATENT DOCUMENTS

60-177661 9/1985 Japan ..................................... 29/840

*Primary Examiner*—Jeff H. Aftergut
*Attorney, Agent, or Firm*—Baker, Maxham, Jester & Meador

[57] ABSTRACT

A manually operable apparatus for selectively assembling chips to substrates comprises a support base having a first support for supporting a substrate preparatory to attachment of a chip thereto, second support for supporting a chip preparatory to selection for attachment to a substrate, a manually operable swing arm assembly mounted on the support base and having a first arm for placement of an adhesive paste to a surface of a substrate on the first support and a second arm for selecting and placing a chip on the substrate.

17 Claims, 4 Drawing Sheets

MANUALLY OPERABLE DIE ATTACH APPARATUS

BACKGROUND OF THE INVENTION

The present invention relates to the art of adhesive bonding of dies or chips to substrates, and more particularly to a manually operable apparatus for accurately placing the bonding paste and semiconductor chips on a substrate for the packaging of semiconductor devices.

The manufacture of electronic devices and components requires the assembly and bonding of various elements together. Adhesive pastes have been used in the semiconductor packaging industry for this purpose in a variety of applications. For example, metallic-glass pastes have been used for attaching semiconductor chips to ceramic substrates in the manufacture of semiconductor devices, and particularly, large scale integrated (LSI) and very large scale (VLSI) circuits. These circuits typically include a semiconductor chip or die, e.g., silicon, gallium arsenide, etc., which is bonded to a supporting ceramic substrate. Commonly assigned U.S. Pat. Nos. 4,636,254, 4,761,224 and 4,968,738 are directed to improved silver-glass die attach pastes for the attachment of a semiconductor die to a ceramic substrate. These patents disclose silver-glass die attach pastes consisting generally of a mixture of silver flake and glass frit distributed in an organic vehicle.

It is often critical in the assembly process that the die be accurately placed on the substrate and that the bond is satisfactory. To form a bond between a semiconductor die and a ceramic wafer substrate, a selected quantity of the die attach paste is placed on the substrate and the die then placed on the paste. The die attach paste is thus positioned between the opposing die and substrate surfaces in a sandwiched relationship. The sample is dried and fired in a oven or furnace at temperatures above the glass transition temperature ($T_g$) of the glass constituent. During the drying and firing stages, the organic vehicle volatilizes and the glass flows to wet the ceramic substrate and die, while the silver flake sinters together. Upon cooling, the result is a secure bond between the die and the substrate.

Another critical aspect of the semiconductor die/ceramic substrate bonding process is that the post-fired adhesive film must have an adequate and preferably uniform bond line thickness. If the bond line thickness is sufficient, the resultant bond will exhibit good resistance to differential thermal expansion rates between the die and substrate, and will produce a bond having a high tensile strength. Interfacial stress that arises from a thermal mismatch between the die and substrate is directly proportional to both the area of attachment and the modulus of elasticity of the bonding paste. This stress is also inversely proportional to the bond line thickness. Since the modulus of elasticity for a given die attach paste is fixed, the only avenue available to reduce interfacial stress is to maintain a sufficient bond line thickness on each part assembled. For the proper bonding of silicon die to ceramic substrates, the bond line thickness must be increased proportionally to the area of the surfaces to be bonded.

It is a characteristic of metal-glass pastes that the paste collapses during drying and firing as the organic materials are eliminated from the composition. The amount of shrinkage varies from case to case. However, if a sufficiently large wet bond line thickness is initially maintained, post-fired bonds exhibiting suitable strength and thermal stress resistance characteristics may be obtained. This requires the accurate placement of paste and die to the substrate.

In production scale semiconductor packaging operations, the control of wet bond line thickness has proven problematic. In some cases, spacing control equipment is not always available. In other cases, the equipment, although available, is not always useable (as, for example, in packages with minimal spacing between the die and the cavity wall). In still other cases, particularly small production runs, manual assembly may be the only alternative. This presents even greater problems of obtaining uniformity of results.

This inability to adequately control wet bond line thickness may result in production runs wherein the final (fired) bond line thickness is inadequate. These items may fail adhesion testing, in which case they must be discarded. To overcome this problem, manufacturers have resorted to applying excess amounts of paste to the die-substrate interface. This, of course, needlessly increases the amount of paste utilized, and significantly extends the required processing time.

Accordingly, a practical solution to the problem of bond uniformity and strength in the packaging of semiconductor devices would be desirable. Thus, an inexpensive manually operable apparatus for the mounting of chips to substrates which achieves uniformity of results is desirable.

SUMMARY OF THE INVENTION

It is therefore the primary object of the present invention to provide an improved inexpensive manually operable apparatus for the mounting of chips to substrates.

In accordance with a primary aspect of the invention, a manually operable apparatus for the accurate and uniform mounting of chips to substrates includes a support structure having means for accurately placing a substrate for receiving an accurately placed and measured quantity of paste, and a swing assembly for selecting accurately positioned chips and precisely placing them on a prepositioned substrate.

BRIEF DESCRIPTION OF THE DRAWINGS

The above and other objects and advantages will become apparent from the following description when read in conjunction with the accompanying drawings wherein.

DETAILED DESCRIPTION OF PREFERRED EMBODIMENTS

Figure 1:
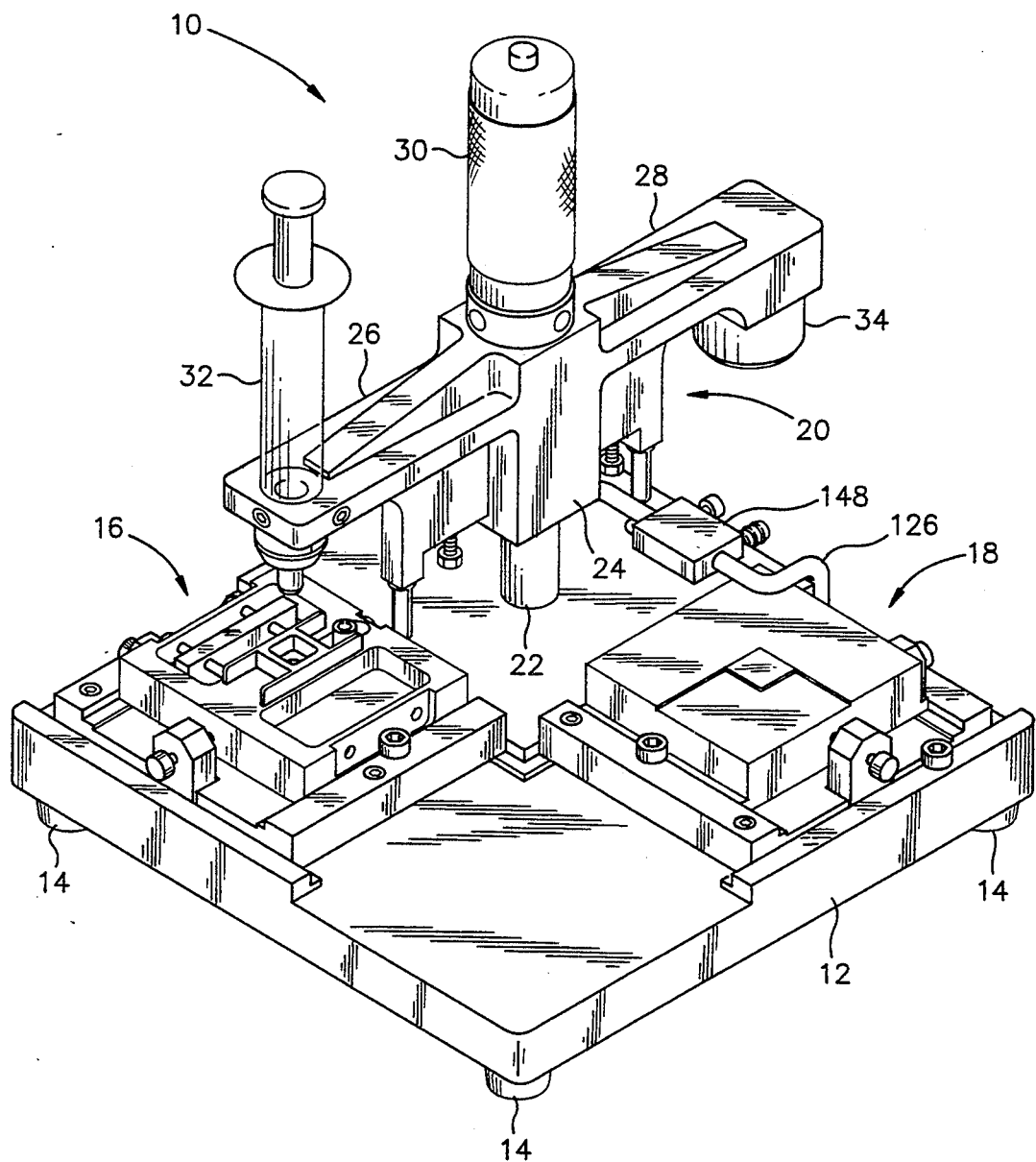
FIG. 1 is a perspective view illustrating a preferred embodiment of the invention.

Referring to FIG. 1 of the drawings, a manually operable chip assembly apparatus for selectively assembling chips to substrates is illustrated in a perspective view, and designated generally by the numeral 10. The apparatus comprises a generally square support base 12 supported on four adjustable leveling feet 14, one at each corner thereof. The base, as illustrated, is generally formed of four quadrants, with a first adjustable support assembly, designated generally at 16, disposed in one quadrant for adjustably positioning and supporting a substrate preparatory to the attachment of a chip thereto. A second adjustable support, designated generally at 18, is disposed in a second quadrant of the support base diagonally across from the first support base, and for supporting a chip preparatory to selection for attachment to a substrate. These support structures each have course and fine XY adjustments for adjustably positioning a chip and substrate with a very high degree of accuracy.

A manually operable swing arm assembly, designated generally at 20, is mounted in a third quadrant of the support base for rotation about and vertically reciprocable movement on a support shaft 22. The swing arm assembly comprises a generally T-shaped structure having a central main body portion 24 and outwardly extending arms 26 and 28. A handle or handgrip 30 for manually grasping and manipulating the swing arm assembly is secured and extends axially upward therefrom.

The swing arm assembly has a paste depositing syringe 32 mounted on one end of the extending arm 26 and a die pick up head 34 on the other extending arm 28 or opposite end of the arm assembly.

Figure 2:
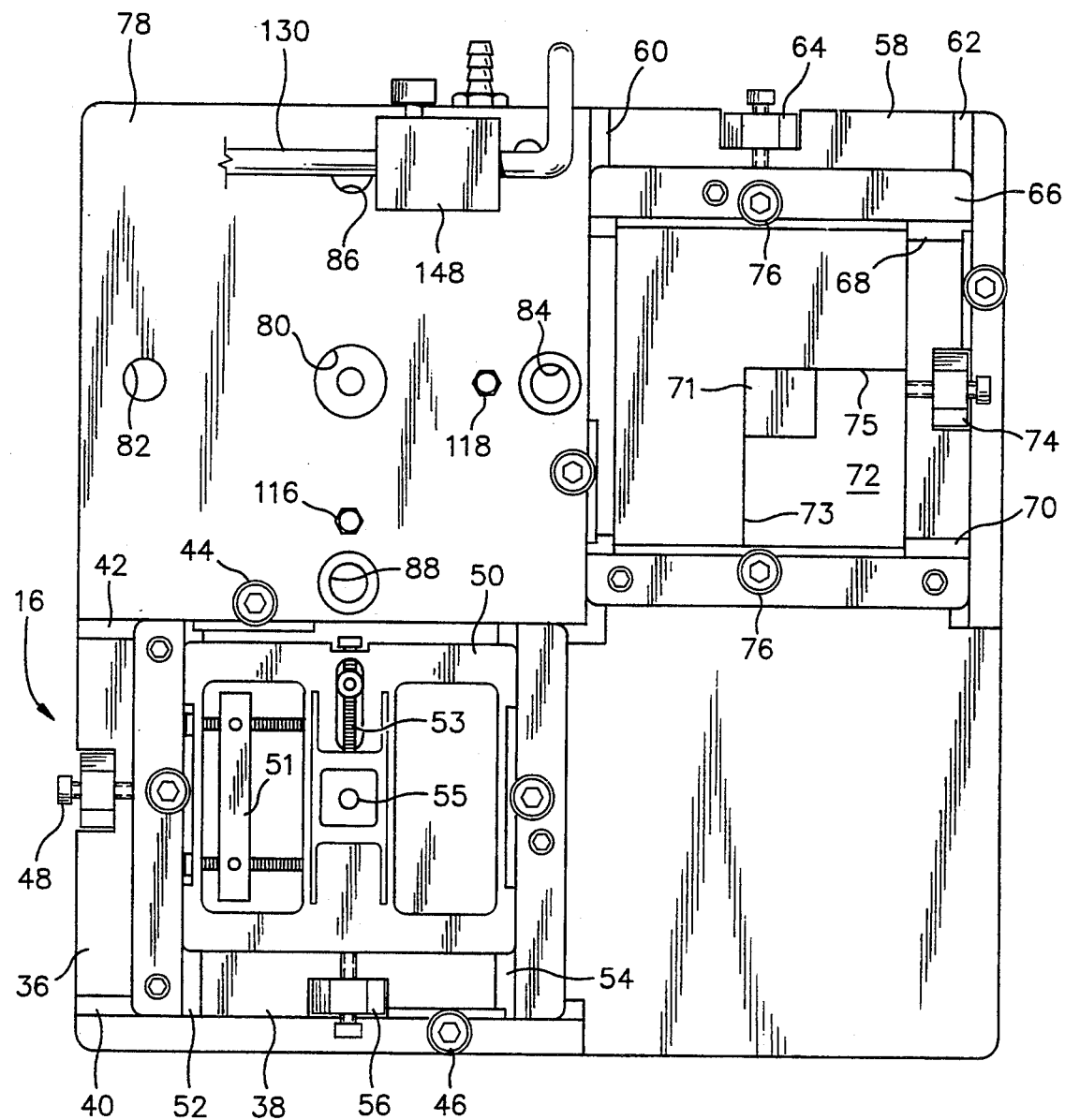
FIG. 2 is a top plan view of the support base of the embodiment of FIG. 1.

Referring to FIGS. 1 and 2, the support base is formed of any suitable rigid material, such as metal or a good grade of rigid plastic with stable dimensions. The base support member is formed with a lower support table 36 in which the first adjustable support assembly 16 is mounted. The first adjustable support assembly 16 comprises a lower support carriage 38 supported in side rails 40 and 42 formed in the base support and retained therein by means of cap screws 44 and 46.

Adjustable means, including a screw and thread assembly 48, adjustably positions the lower support table 36 in the side rails 40 and 42 for movement along an X axis. An upper support table 50 is mounted on the lower support table in side rails 52 and 54 for adjustable movement therealong by means of a screw and thread assembly 56. The screw and thread assembly 56 adjustably positions the upper support table 50 along a Y axis relative to the lower table and the support base. Adjustable stops 51 and 53 are adjustable to fix the position of two sides of the substrate. A vacuum hold down is provided by means of a vacuum port 55 which acts on the underside of a substrate. The vacuum port is connected by vacuum line 128 (FIG. 6) to the vacuum source.

The second adjustable support 18 is mounted in a quadrant 58 on side support rails 60 and 62 and adjustable therealong by means of a screw and thread assembly 64. The second adjustable support 18 includes a lower support table 66 slidably mounted in the support rails 60 and 62, and is similarly provided with support rails 68 and 70 in which an upper support table 72 is slidably mounted and adjustable by means of a screw and thread assembly 74. The upper support table 72 is moveable along the X axis on the lower support table 66 and is secured in adjusted position by means of a pair of cap screws 76. A chip or die 71 is positioned on the upper support table 72 by means of shoulders 73 and 75.

The support base is provided with a stepped up area in a quadrant 78 in which the swing arm assembly 20 is mounted. A centrally located bore 80 receives and mounts the vertically extending stationary support shaft 22. A pair of alignment and guide bores 84 and 88 are provided for receiving guide pins and guiding the swing arm assembly along an X axis. A pair of clearance holes 82 and 86 receive the pins of the arm assembly for guiding and aligning the swing arm assembly along a Y axis.

Figure 3:
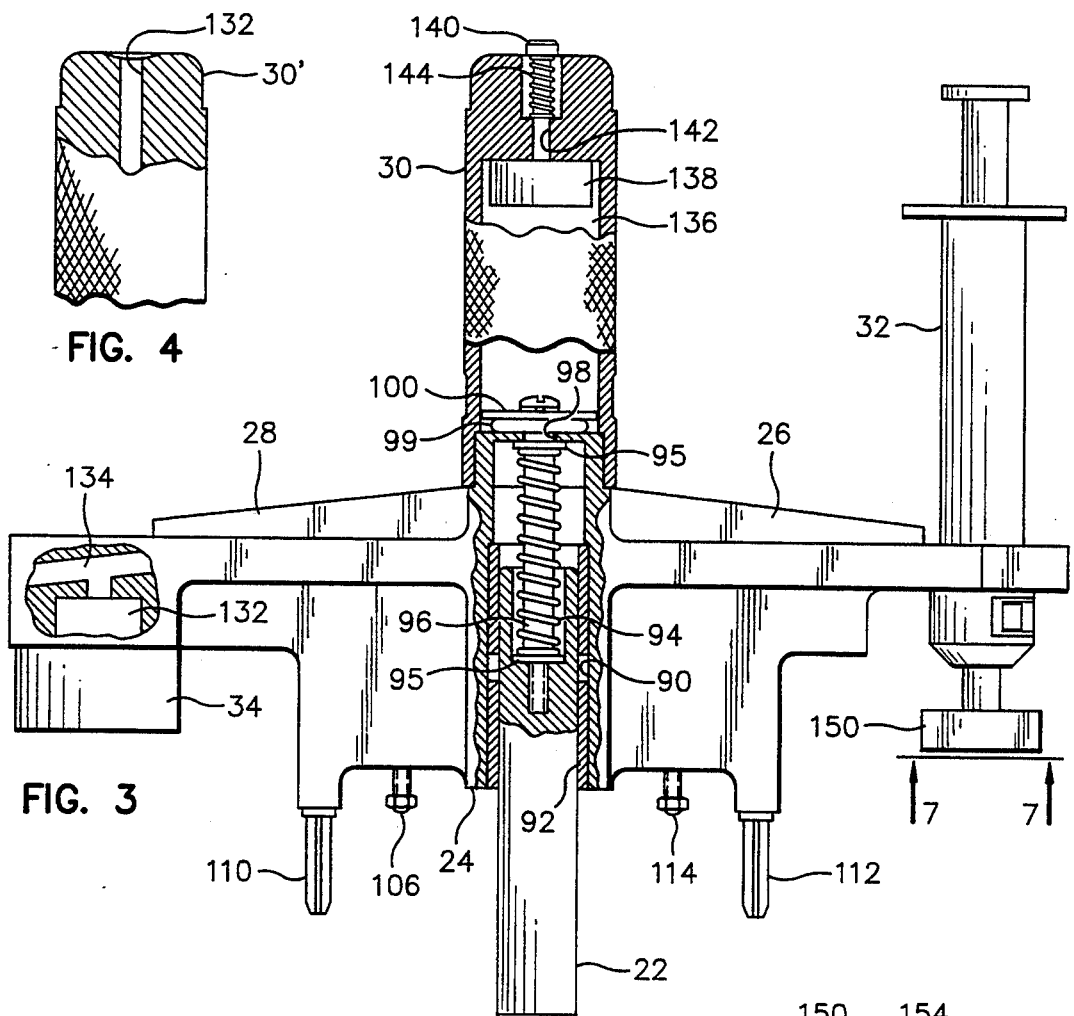
FIG. 3 is a side elevation view with portions broken away to show details of the swing arm assembly.

The swing arm assembly, as best seen in FIG. 3, comprises a central main body portion 24 forming a hub having a central bore 90 in which is disposed suitable bearings, such as sleeve bearings 92, supporting the swing arm assembly for rotation and vertical movement on the support shaft 22. Disposed within the bore and against the upper end of the shaft is a spring assembly, including a compression coil spring 94, positioned over a pin 96 secured in the upper end of the support shaft 22 and extending through a bore 98 in the upper end of the swing arm, hub with a retaining washer assembly 100 thereon. The coil spring 94 bears against plastic wear washers 95 at its ends and acts to bias the swing arm to its uppermost position. An 0-ring 99 is positioned over the upper end of pin 96 and beneath washer 100.

Figure 5:
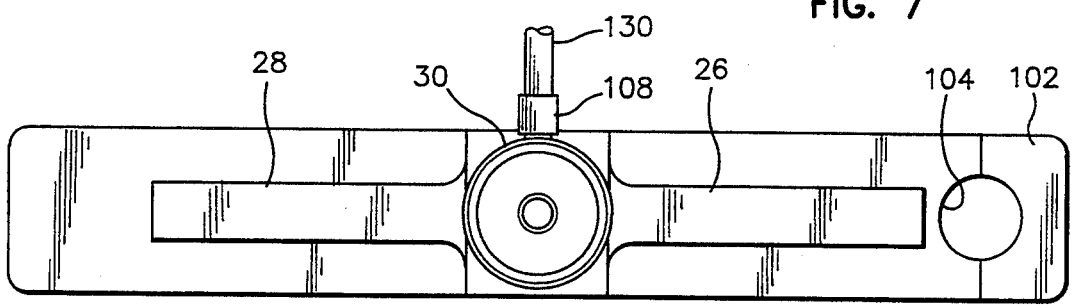
FIG. 5 is a top plan view of the swing arm assembly of FIG. 1.

The extending arm 26 includes a clamp assembly with a clamp member 102 at the outer end thereof. The clamp member 102 has a semi-circular cut-out matched to one in the end of extending arm 26 forming a circular bore 104 within the outer end of the arm for receiving a die attach paste injector or syringe 32, as shown in FIGS. 1 and 3. The clamp member 102 is detachably secured to the end of the arm by suitable means, such as cap screws, not shown. The opposite end of the arm assembly, specifically extending arm 28, is provided with a suitable die pick up head 34 for gripping chips. Vacuum is applied to the die pick up head 34 supplied by means of vacuum line 130 connected at vacuum port 108 (FIG. 5).

The arm assembly includes a pair of guide pins or fingers 110 and 112 extending downward from a lower extension thereof for engaging the respective alignment and guide bores 84 and 88 in the base (FIG. 2). These align and guide the arm assembly as it respectively deposits solder paste on the substrate, picks up a chip and deposits or positions it on the substrate. The arm assembly is similarly provided with a pair of stop members 106 and 114 adjacent the guide pins 110 and 112 for engaging the heads of stop bolts or pins 116 and 118 on the support base. The stops may be adjusted to precisely adjust the vertical positioning of the respective arms as they place the adhesive paste and pick up and place the chip on the substrate.

Figure 6:
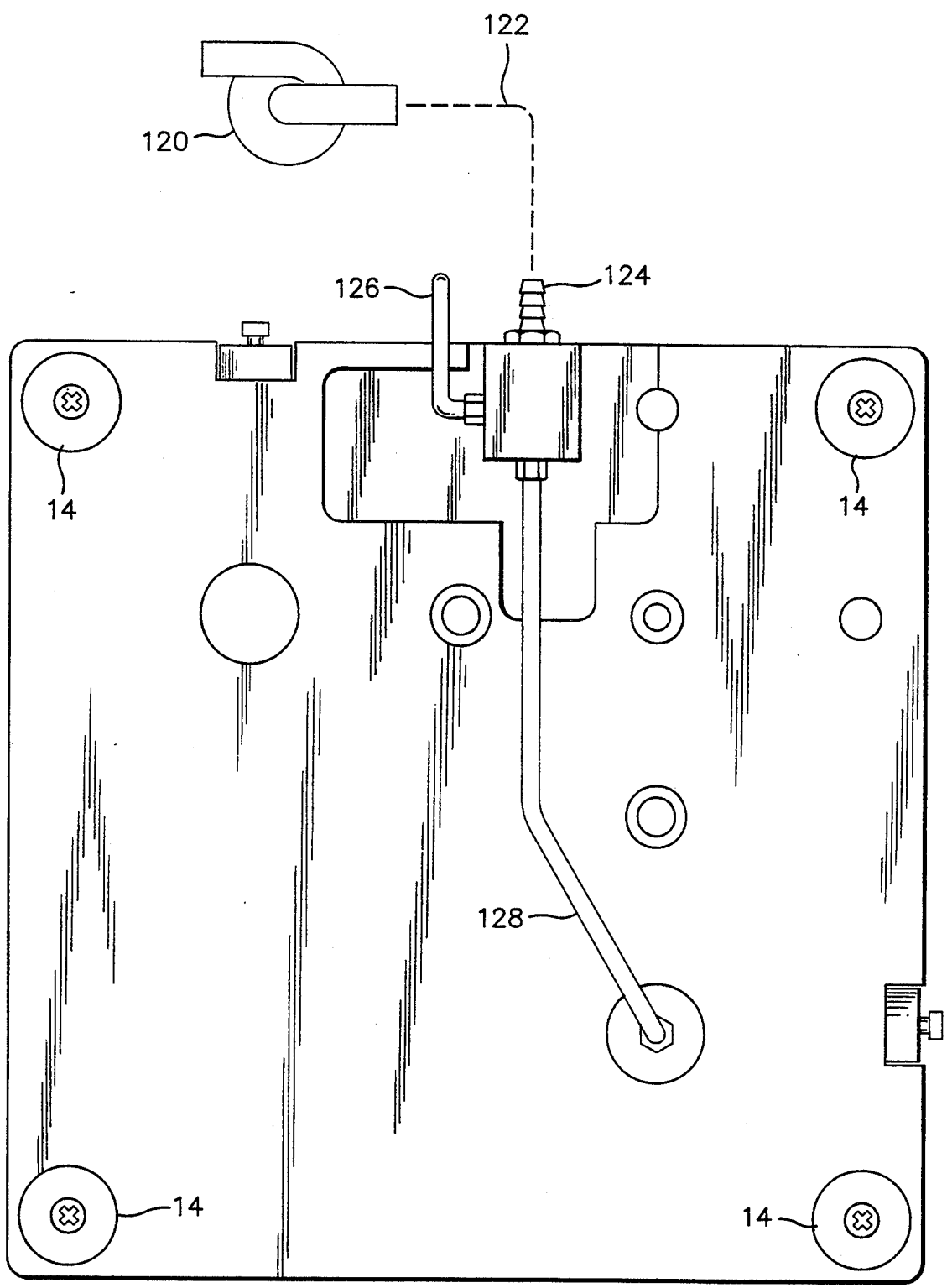
FIG. 6 is a plan view from the bottom of the support base.

Referring now to FIG. 6, the overall assembly is provided with a vacuum system for operation of the clamps or holders to hold the respective substrate and chip and to operate the pick up grip for gripping the chip. As shown in FIG. 5, a source of vacuum, such as a vacuum pump 120, is connected by a suitable line 122 to a connector port 124 for supplying vacuum by means of a manifold and a series of vacuum lines 126, 128 and 130 to the respective vacuum clamps and grips. The vacuum line 130 connects to vacuum port 108 on the swing arm assembly and opens or communicates via a line and a port 132 to the die pick up head 34.

In a preferred embodiment, a vacuum line or passage communicates with bore or chamber 136 in handle or hand grip 30. A valve member 138 is mounted on a stem 140 in bore 142 and biased by a compression spring 144 to a closed position. The valve member 138 covers vent ports 146 in the closed position, so that the vacuum pick up head 124 is always active until vented by pressing on the upper end of stem 140. A chip or die is automatically picked up when contacted by die pick up head 34 and is released when die pick up head 34 is vented. An adjustable valve member 148 (FIG. 2) may be provided in the vacuum system to adjust the vacuum to the die pick up head 34 and to the hold down vacuum port 55.

Figure 4:
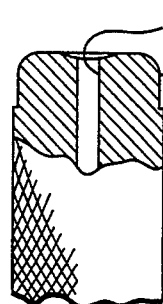
FIG. 4 is a detailed partial view cf a portion of the handgrip of FIG. 3.

In another embodiment, FIG. 4, the die pick up head 34 is activated by the operator placing a thumb over and closing the port 132 in handle or hand grip 30. This activates the die pick up 34 to grip and pick up the chip or die to place it on the substrate. Thereafter, removing the thumb from the port 132 releases the chip as it is placed on the substrate.

Figure 7:
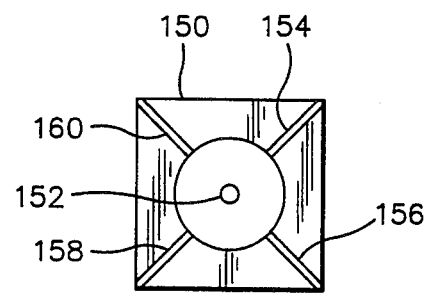
FIG. 7 is a view from the bottom of the dispensing head of FIG. 3.

Referring to FIG. 7, a paste dispensing head 150 for the paste syringe 32 is illustrated. The dispensing head has a face with a central port 152 for receiving paste from the barrel of the syringe, and channels 154, 156, 158 and 160 for distributing it outward over the face of the die. The face of the head is positioned in substantially close contact with the surface of the substrate and the paste dispensed. The paste flows out along the channels over the area of the surface of the substrate. A head, such as that disclosed in U.S. Pat. No. 4,803,124, issued Feb. 7, 1989 to Kunz, may be used.

While various preferred embodiments have been shown and described, including embodiments directed to both epoxy and metal-glass compositions, it should be understood that modifications and adaptations thereof will occur to persons skilled in the art. Therefore, the protection afforded the invention should not be limited except in accordance with the spirit of the following claims and their equivalents.

We claim:

1. A manually operable chip assembly apparatus for selectively assembling chips to substrates, comprising:
   a support base;
   first support means on said base for supporting a substrate preparatory to attachment of a chip thereto;
   second support means on said base for supporting a chip preparatory to selection for attachment to a substrate;
   a support post mounted on and extending generally vertically from said support base; and
   a manually operable swing arm assembly having a central hub mounted on said support post, for rotation about and reciprocation along said post, said arm assembly having first arm means for placement of an adhesive paste to a surface of a substrate on said first support means, and second arm means having vacuum operated grip means for selecting and placing a chip on said substrate.

2. A manually operable chip assembly apparatus for selectively assembling chips to substrates, comprising:
   a support base;
   first support means on said base for supporting a substrate preparatory to attachment of a chip thereto;
   second support means on said base for supporting a chip preparatory to selection for attachment to a substrate; and
   a manually operable swing arm assembly comprising a support post having a longitudinal axis, mounted on and extending generally vertically from said support base, and an arm assembly having a central hub mounted for rotation about and reciprocation along the axis of said post, said arm assembly having first arm means for placement of an adhesive paste to a surface of a substrate on said first support means, and second arm means having vacuum operated grip means for selectively gripping a chip and placing said chip on said substrate, wherein said arm member includes a hand grip extending vertically from a top thereof coaxially of the axis of said post.

3. The manually operable assembly apparatus of claim 2 wherein said arm member includes said first arm means and said second arm means extending in opposite directions from said hub.

4. A manually operable chip assembly apparatus for selectively assembling chips to substrates, comprising:
   a support base;
   first support means on said base for supporting a substrate preparatory to attachment of a chip thereto;
   second support means on said base for supporting a chip preparatory to selection for attachment to a substrate; and
   a manually operable swing arm assembly comprising a support post having a longitudinal axis, mounted on and extending generally vertically from said support base, and an arm assembly having a central hub mounted for rotation about and reciprocation along the axis of said post, said arm assembly having first arm means for placement of an adhesive paste to a surface of a substrate on said first support means, and second arm means having vacuum operated grip means for selectively gripping a chip and placing said chip on said substrate, wherein said arm member includes guide and limit means for guiding and limiting said arm member to said reciprocation when aligned when orthogonal x and y axes.

5. A manually operable chip assembly apparatus for selectively assembling chips to substrates, comprising:
   a support base;
   first support means on said base for supporting a substrate preparatory to attachment of a chip thereto;
   second support means on said base for supporting a chip preparatory to selection for attachment to a substrate;
   a manually operable swing arm assembly comprising a support post having a longitudinal axis, mounted on and extending generally vertically from said support base, and an arm assembly having a central hub mounted for rotation about and reciprocation along the axis of said post, said arm assembly having first arm means for placement of an adhesive paste to a surface of a substrate on said first support means, and second arm means having vacuum operated grip means for selectively gripping a chip and placing a chip on said substrate;
   said manually operable swing arm assembly mounted on said support base in a first quadrant thereof;
   said first support means is mounted on said base in a second quadrant thereof; and second support means is mounted on said base in a third quadrant thereof diagonal from said second quadrant.

6. The manually operable assembly apparatus of claim 5 wherein:
   said first support means includes adjusting means for adjustment along x and y axes on said base; and second support means includes adjusting means for adjustment along x and y axes on said base.

7. The manually operable assembly apparatus of claim 6 further comprising a source of vacuum, and wherein said second arm means on said swing arm assembly for selecting and placing a chip on said substrate includes vacuum responsive gripping means responsive to said source of vacuum for selectively gripping a chip on said second support means and for positioning and releasing said chip on said substrate.

8. The manually operable assembly apparatus of claim 6 wherein said swing arm assembly comprises a support post having a longitudinal axis, mounted on and extending generally vertically from said support base, and an arm member having a central hub mounted for rotation about and reciprocation along the axis of said post.

9. A manually operable chip assembly apparatus for selectively assembling chips to substrates, comprising:
a support base having a generally planar horizontally extending upper support surface;
first adjustable support means adjustable along orthogonal x and y axes on said base for supporting a substrate preparatory to attachment of a chip thereto;
second adjustable support means adjustable along orthogonal x and y axes on said base for supporting a chip preparatory to selection for attachment to a substrate;
a support post having a longitudinal axis, mounted on and extending generally vertically from said support base; and
a manually operable swing arm assembly having a central hub mounted for rotation about and reciprocation along the axis of said post, said arm assembly having first arm means having means on an outer end thereof for placement of an adhesive paste onto a surface of a substrate on said first support means, and second arm means having gripping means on an outer end thereof for selecting and placing a chip on said substrate.

10. The manually operable assembly apparatus of claim 9 wherein said arm assembly includes guide and limit means for guiding and limiting vertical reciprocation of said arm assembly to said reciprocation when one of said arm means is aligned with one of said orthogonal x and y axes, 11. The manually operable assembly apparatus of claim 10 wherein said arm member includes a hand grip extending vertically from a top thereof coaxially of the axis of said post.

12. The manually operable assembly apparatus of claim 11 wherein said second arm means on said swing arm assembly for selecting and placing a chip on said substrate includes vacuum responsive gripping means for selective gripping a chip on said first support means and for positioning and releasing said chip on said substrate, 13. The manually operable assembly apparatus of claim 12 wherein:
said manually operable swing arm assembly is mounted on said support base in a first quadrant thereof;
said first support means is mounted on said base in a second quadrant thereof; and
second support means is mounted on said base in a third quadrant thereof diagonal from said second quadrant.

14. The manually operable assembly apparatus of claim 9 further comprising a source of vacuum, and wherein said second arm means on said swing arm assembly for selecting and placing a chip on said substrate includes vacuum responsive gripping means responsive to said source of vacuum for selectively gripping a chip on said second support means and for positioning and releasing said chip on said substrate.

15. A manually operable chip assembly apparatus for selectively assembling chips to substrates, comprising:
a support base having a generally planar horizontally extending upper support surface;
first adjustable support means adjustable along orthogonal x and y axes on said base for supporting a substrate preparatory to attachment of a chip thereto;
second adjustable support means adjustable along orthogonal x and y axes on said base for supporting a chip preparatory to selection for attachment to a substrate;
a support post having a longitudinal axis mounted on and extending generally vertically from said support base; and
a manually operable swing arm assembly having a central hub mounted for rotation about and reciprocation along the axis of said post, a hand grip extending vertically from a top thereof coaxially of the axis of said post, a first elongated arm having adhesive placement means on an outer end thereof for placement of a quantity of adhesive paste to a surface of a substrate on said first support means, and a second elongated arm having vacuum operated gripping means on an outer end thereof controllable from said hand grip for selecting and placing a chip on said substrate;
a source of vacuum, said vacuum responsive gripping means connected to said source of vacuum for selectively gripping a chip on said second support means and for positioning and releasing said chip on said substrate; and
guide and limit means for guiding and limiting vertical reciprocation of said arm assembly to said reciprocation when one of said arm means is aligned with one of said orthogonal x and y axes.

16. The manually operable assembly apparatus of claim 15 wherein:
said manually operable swing arm assembly is mounted on said support base in a first quadrant thereof;
said first support means is mounted on said base in a second quadrant thereof; and
second support means is mounted on said base in a third quadrant thereof diagonal from said second quadrant.

17. A manually operable chip assembly apparatus for selectively assembling chips to substrates, comprising:
a support base having a generally square horizontally extending planar support surface;
first adjustable support means mounted on said base in a first quadrant thereof for supporting and selectively positioning a substrate preparatory to attachment of a chip thereto;
second adjustable support means mounted on said base in a second quadrant thereof diagonal from said first quadrant for supporting and selectively positioning a chip preparatory to selection for attachment to a substrate;

a support shaft mounted on said base in a third quadrant and extending vertically from said support surface;

a manually operable swing arm assembly having a central hub rotatably and reciprocably mounted on said support shaft, a hand grip extending upward from and coaxially with said hub for manual manipulation of said arm assembly, said arm assembly having a first arm extending outward in a first direction from said hub and having an adhesive dispenser detachably mounted on an outer end thereof for placement of an adhesive paste to a surface of a substrate supported on said first support means, and second arm extending outward in a second direction from said hub and having a vacuum gripping head detachably mounted on an outer end thereof for selectively gripping a chip for placing said chip on said substrate; and guide and limit means for guiding and limiting said arm member to said reciprocation when aligned with orthogonal x and y axes which are aligned with said first and second adjustable support means.

* * * * *